(12) United States Patent  (10) Patent No.: US 7,764,328 B2
Park  (45) Date of Patent: Jul. 27, 2010

(54) ORGANIC ELECTROLUMINESCENT DISPLAY DEVICE

(75) Inventor: Jae-Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 350 days.

(21) Appl. No.: 12/068,440

(22) Filed: Feb. 6, 2008

(65) Prior Publication Data

US 2008/0136323 A1 Jun. 12, 2008

Related U.S. Application Data

(62) Division of application No. 11/023,605, filed on Dec. 29, 2004, now Pat. No. 7,348,605.

(30) Foreign Application Priority Data

Dec. 30, 2003 (KR) .......................... 2003-0099858

(51) Int. Cl.
*G02F 1/136* (2006.01)

(52) U.S. Cl. .......................... 349/42; 349/19; 349/33; 349/41; 349/43; 349/44

(58) Field of Classification Search ................. 349/19, 349/33, 41, 42, 43, 44
See application file for complete search history.

(56) References Cited

U.S. PATENT DOCUMENTS 6,515,428 B1 * 2/2003 Yeh et al. ................. 315/169.3
2002/0005696 A1 1/2002 Yamazaki et al. ........ 315/169.3
2002/0027229 A1 3/2002 Yamazaki et al. ............. 257/84
2004/0004591 A1 1/2004 Akimoto et al. ............... 345/84
2004/0012058 A1 1/2004 Aoki .......................... 257/414
2004/0100608 A1 5/2004 Matsueda et al. ........... 349/149
2005/0280618 A1 * 12/2005 Sato et al. ..................... 345/82

* cited by examiner

*Primary Examiner*—Jennifer Doan
(74) *Attorney, Agent, or Firm*—Morgan Lewis & Bockius LLP

(57) ABSTRACT

An organic electroluminescent display device comprises a substrate including a display region, and a pad region in a periphery of the display region, the display region including a pixel region; a gate pad, a data pad and a power pad in the pad region, the gate pad, the data pad and the power pad electrically connected to a gate line, a data line and a power line, respectively; a first electrode in the pixel region, the first electrode connected to the driving thin film transistor; an organic electroluminescent layer on the first electrode; a second electrode over an entire surface of the substrate including the organic electroluminescent layer; a dummy pad in the pad region, the dummy pad electrically connected to at least one of the power line and the second electrode; and a ground pad in the pad region, the ground pad electrically connected to the second electrode.

10 Claims, 7 Drawing Sheets

ORGANIC ELECTROLUMINESCENT DISPLAY DEVICE

The present invention is a divisional application of copending application Ser. No. 11/023,605, filed on Dec. 29, 2004, now U.S. Pat. No. 7,348,605 which claims the benefit of Korean patent Application No. 2003-0099858 filed in Korea on Dec. 30, 2003, which is hereby incorporated by reference.

BACKGROUND OF THE INVENTION

1. Field of the Invention

The present invention relates to a display device, and more particularly, to an organic electroluminescent display (OELD) device.

2. Discussion of the Related Art

In general, an OELD device emits light by injecting electrons from a cathode and injecting holes from an anode into an emission layer, combining the electrons with the holes, generating excitons, and transitioning the excitons from an excited state to a ground state. Unlike liquid crystal display (LCD) devices, an OELD does not require an additional light source to emit light since the transition of the excitons between the excited and ground states causes light emission. Accordingly, the size and weight of the OELD device is less than that of an LCD device. In addition, the OELD device has low power consumption, superior image brightness, and fast response time. Thus, the OELD devices are employed in consumer electronic applications, such as cellular phones, car navigation systems (CNS), personal digital assistants (PDA), camcorders, and palmtop computers. Moreover, since OELD devices are manufactured using a relatively simple fabrication process, OELD production costs much less than LCD.

There are currently at least two different types of OELD devices: passive matrix OELD devices and active matrix OELD devices. Although the passive matrix OELD devices have simple structures and are formed by simple fabrication processes, passive matrix OELD devices require a relatively high amount of power to operate. In addition, the display size of passive matrix OELD devices is limited due to their structure. Furthermore, as the number of conductive lines increases in a passive matrix OELD device, an aperture ratio of the passive matrix OELD devices decreases. On the other hand, active matrix OELD devices have a high emission efficiency and can produce high-quality images for larger displays with relatively low power consumption.

FIG. 1 is a cross-sectional view of an OELD device according to the related art. Referring to FIG. 1, an OELD device 10 includes first and second substrates 12 and 28 that are spaced apart from each other and bonded together using a sealant 26. The first substrate 12 includes an array element layer 14 having a thin film transistor (TFT) T formed on an inner surface of the first substrate 12. A first electrode 16, an organic electroluminescent (EL) layer 18, and a second electrode 20 are sequentially formed on the array element layer 14. The organic EL layer 18 may include red, green, and blue emission layers to display full-color images. Each of the red, green, and blue emission layers may be disposed in each pixel region P. The second substrate 28 includes a moisture absorbent desiccant 22 that eliminates moisture and oxygen that may penetrate the organic EL layer 18. The moisture absorbent desiccant 22 is disposed within an etched portion of the second substrate 28, and is fixed by a holding element 25.

FIG. 2 is a plan view of an array element layer of an OELD device according to the related art. Referring to FIG. 2, the array element layer 14 (shown in FIG. 1) includes a switching thin film transistor $T_S$, a driving thin film transistor $T_D$, and a storage capacitor $C_{ST}$ formed on a transparent insulating substrate 12, such as glass or plastic. The switching thin film transistor $T_S$ and the driving thin film transistor $T_D$ may include a combination of at least one TFT. In addition, a gate line 32 and a data line 34 crossing each other are formed on the substrate 12. A pixel region P is defined by a crossing of the gate line 32 and the data line 34. An insulating layer (not shown) is interposed between the gate line 32 and the data line 34. A power line 35 is disposed parallel to and spaced apart from the data line 34 and also crosses over the gate line 32.

In FIG. 2, the switching thin film transistor $T_S$ includes a switching gate electrode 36, a switching active layer 40, a switching source electrode 46, and a switching drain electrode 50. Similarly, the driving thin film transistor $T_D$ includes a driving gate electrode 38, a driving active layer 42, a driving source electrode 48 and a driving drain electrode 52. The switching gate electrode 36 is connected to the gate line 32, and the switching source electrode 46 is connected to the data line 34. The switching drain electrode 50 is connected to the driving gate electrode 38 via a first contact hole 54. The driving source electrode 48 is connected to the power line 35 via a second contact hole 56. In addition, the driving drain electrode 52 is connected to a first electrode 16 at the pixel region P. The power line 35 overlaps a first capacitor electrode 15. An insulating layer is interposed therebetween to form the storage capacitor $C_{ST}$.

Although not shown, a gate pad, a data pad and a power pad are disposed in a pad region in a periphery region of a display region transmitting light. The gate pad, the data pad and the power pad are formed in end portions of the gate line, the data line and the power line, respectively. Further, a ground signal is applied to a ground pad and it is disposed in one of the portions corresponding to the gate, the data and the power pads. In general, the power pad and the ground pad are disposed in their respective areas in the pad portions. Therefore, current or carrier may flow in a certain direction, so that a non-uniform image quality occurs due to a resistance deviation in a large size model different from a small size model.

FIG. 3 is a plan view of an OELD device according to the related art. Referring to FIG. 3, a substrate 12 is prepared with a display region DD and a pad region PP in a periphery of the display region DD. The pad region PP includes first to fourth pad regions PP1 to PP4. The first pad region PP4 is disposed adjacent to the second pad region PP2. A gate pad 60, a data pad 50, a power pad 70 and a ground pad 80 are formed in the first to fourth pad regions PP1 to PP4, respectively. For example, a gate signal, a data signal, a power signal and a ground signal are applied to the gate pad 60, the data pad 50, the power pad 70 and the ground pad 80 through tape automated bonding, respectively.

The first electrode 16 (shown in FIG. 1) in the pixel region P (shown in FIG. 1) is connected to the driving thin film transistor $T_D$ (shown in FIG. 2), the organic electroluminescent layer 18 (shown in FIG. 1) is disposed on the first electrode 16, and the second electrode 20 (shown in FIG. 1) is disposed over the entire surface of the substrate 12 having the organic electroluminescent layer 18. The electric potential of the second electrode 20 can be maintained by applying a common voltage through the ground pad 80.

For example, the second electrode 20 and the ground pad 80 are connected to each other via a first contact hole 27 in the display region DD and the ground pad 80 is connected to an external circuit (not shown) via a second contact hole 29 in the pad region PP. It should be noted that a moving direction 90 of the carriers or current is from the power pad 70 to the ground pad 80. Therefore, the power pad 70 may be defined as a pad where a flow of carriers or current begins, and the ground pad 80 may be defined as a pad where the flow of the carrier or current ends.

In other words, carrier or current flows along one direction from in the third pad portion PP3 to the fourth pad portion PP4. Consequently, when this arrangement structure for the pad region PP is applied to a small size OELD model, a resistance deviation can be reduced because of the small size of the OELD. Therefore, image quality problems do not occur in all regions of the OELD. However, the bigger the size of the OELD panel, the lower the image quality.

SUMMARY OF THE INVENTION

Accordingly, the present invention is directed to organic electroluminescent display device that substantially obviates one or more of the problems due to limitations and disadvantages of the related art.

An object of the present invention is to provide an OELD device having a uniform image quality.

Another object of the present invention is to provide a dual panel type OELD device having a uniform image quality.

Additional features and advantages of the invention will be set fourth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a substrate including a display region, and a pad region in a periphery of the display region, the display region including a pixel region; a gate line, a data line crossing the gate line, and a power line on the substrate in the display region, the power line crossing one of the gate line and the data line; a switching thin film transistor and a driving thin film transistor in the pixel region, the switching thin film transistor connected to the gate line and the data line, and the driving thin film transistor connected to the switching thin film transistor and the power line; a gate pad, a data pad and a power pad in the pad region, the gate pad, the data pad and the power pad electrically connected to the gate line, the data line and the power line, respectively; a first electrode in the pixel region, the first electrode connected to the driving thin film transistor; an organic electroluminescent layer on the first electrode; a second electrode over an entire surface of the substrate including the organic electroluminescent layer; a dummy pad in the pad region, the dummy pad electrically connected to at least one of the power line and the second electrode; and a ground pad in the pad region, the ground pad electrically connected to the second electrode.

In another aspect, an organic electroluminescent display device includes a substrate including a display region, and first to fourth pad regions in a periphery of the display region, the display region including a pixel region, the first pad region adjacent to the second pad region, the first pad region facing the third pad region; a gate line, a data line crossing the gate line, and a power line on the substrate in the display region, the power line crossing one of the gate line and the data line; a switching thin film transistor and a driving thin film transistor in the pixel region, the switching thin film transistor connected to the gate line and the data line, and the driving thin film transistor connected to the switching thin film transistor and the power line; a gate pad and a data pad in at least one of the first to fourth pad regions, the gate pad and the data pad electrically connected to the gate line and the data line, respectively; a second substrate facing and spaced apart from the first substrate, the second substrate corresponding to the display region of the first substrate; a first electrode on an entire surface of the second substrate; an organic electroluminescent layer on the first electrode; a second electrode on the organic electroluminescent layer in the pixel region; a connection electrode connecting the second electrode and the driving thin film transistor, the connection electrode between the first substrate and the second substrate; a plurality of dummy pads electrically connected to the power line, the plurality of dummy pads including a first dummy pad in the first pad region and a second dummy pad in the second pad region; and a ground pad in the third pad region, the ground pad electrically connected to the first electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
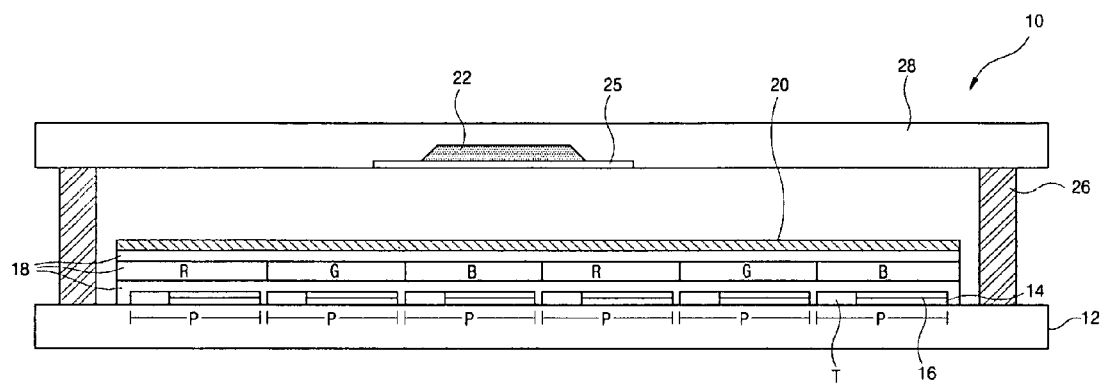
FIG. 1 is a cross-sectional view of an OELD device according to the related art.
Figure 2:
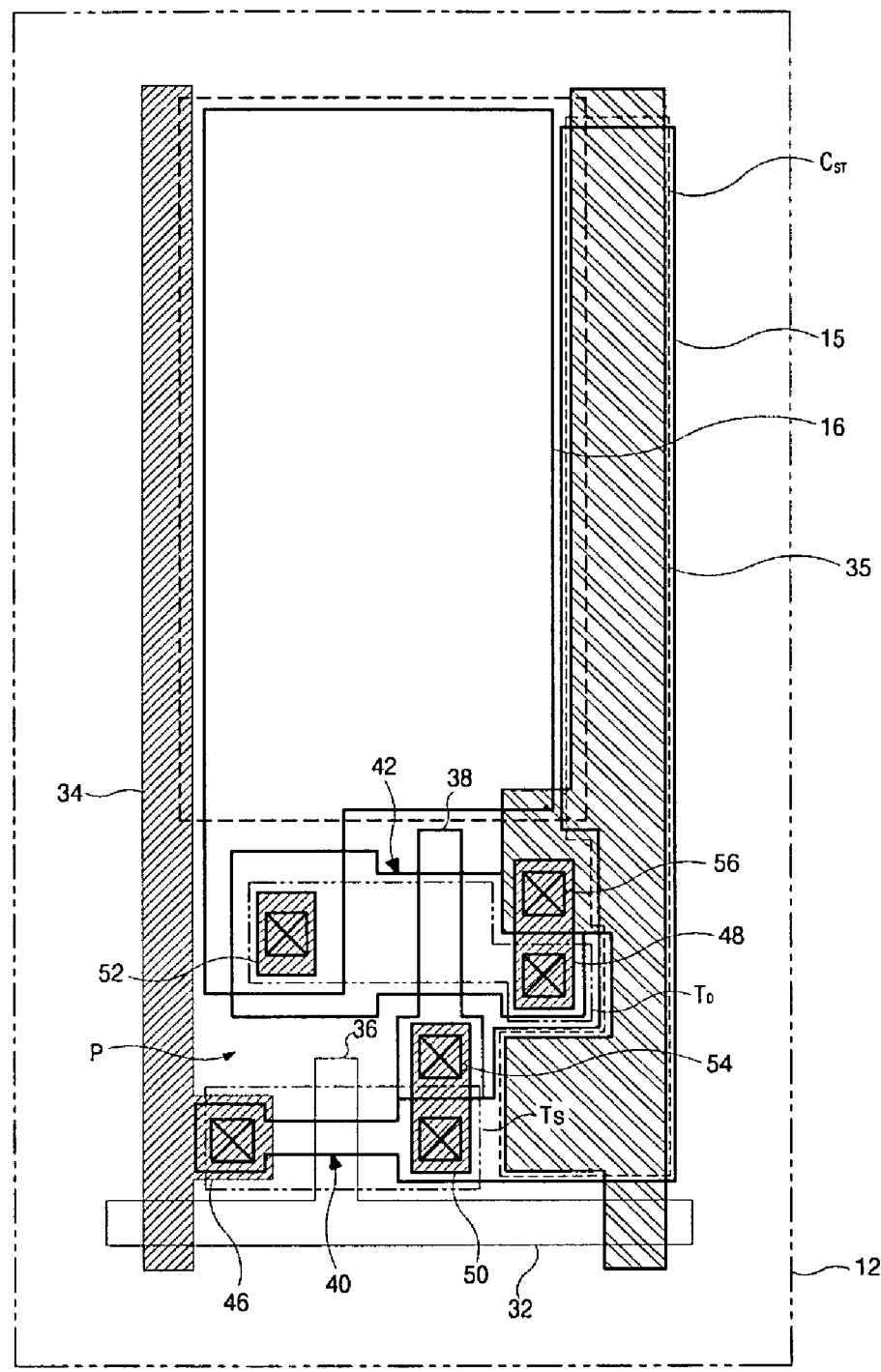
FIG. 2 is a plan view of an array element layer of an OELD device according to the related art.
Figure 3:
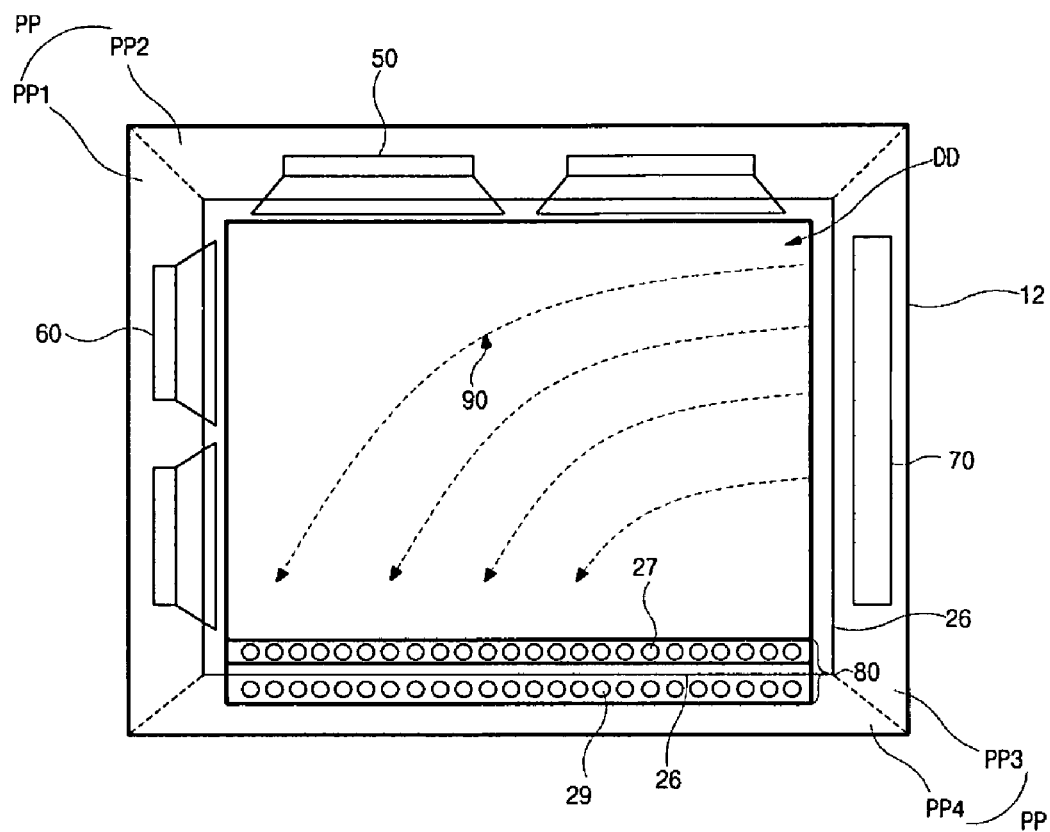
FIG. 3 is a plan view of an OELD device according to the related art.
Figure 4A:
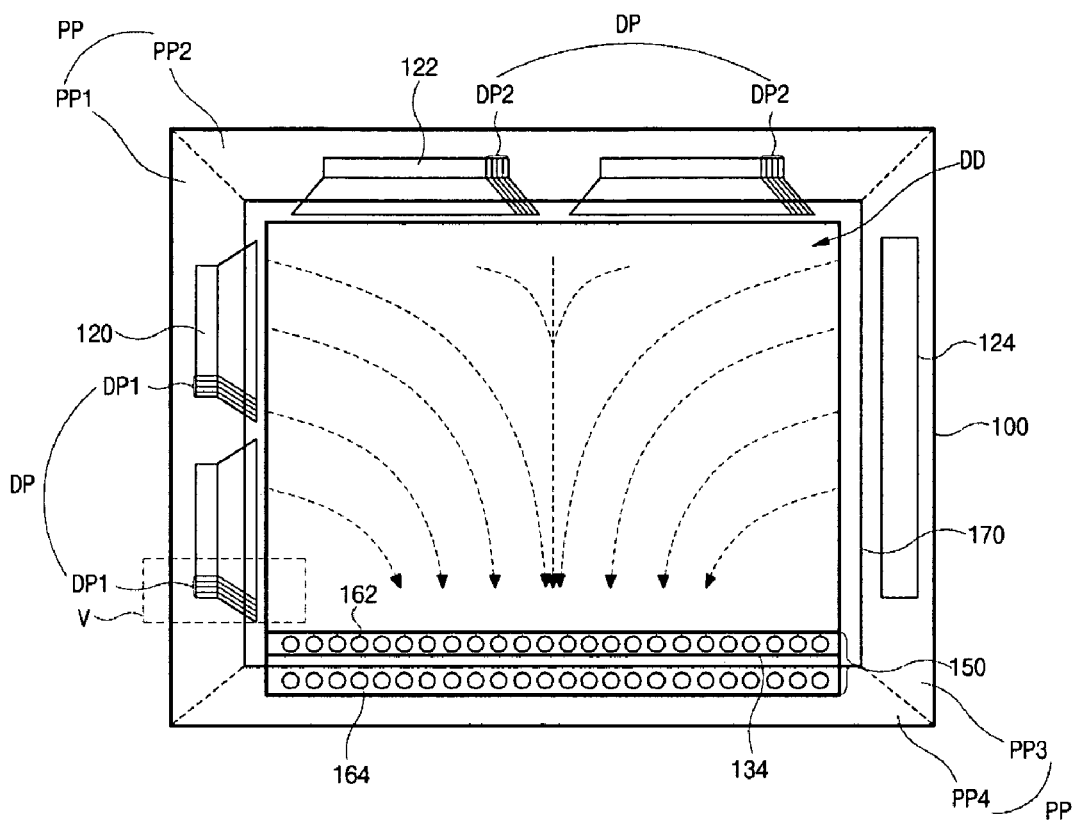
FIG. 4A is a plan view of a display region and a pad region in an exemplary OELD device according to an embodiment of the present invention.
Figure 4B:
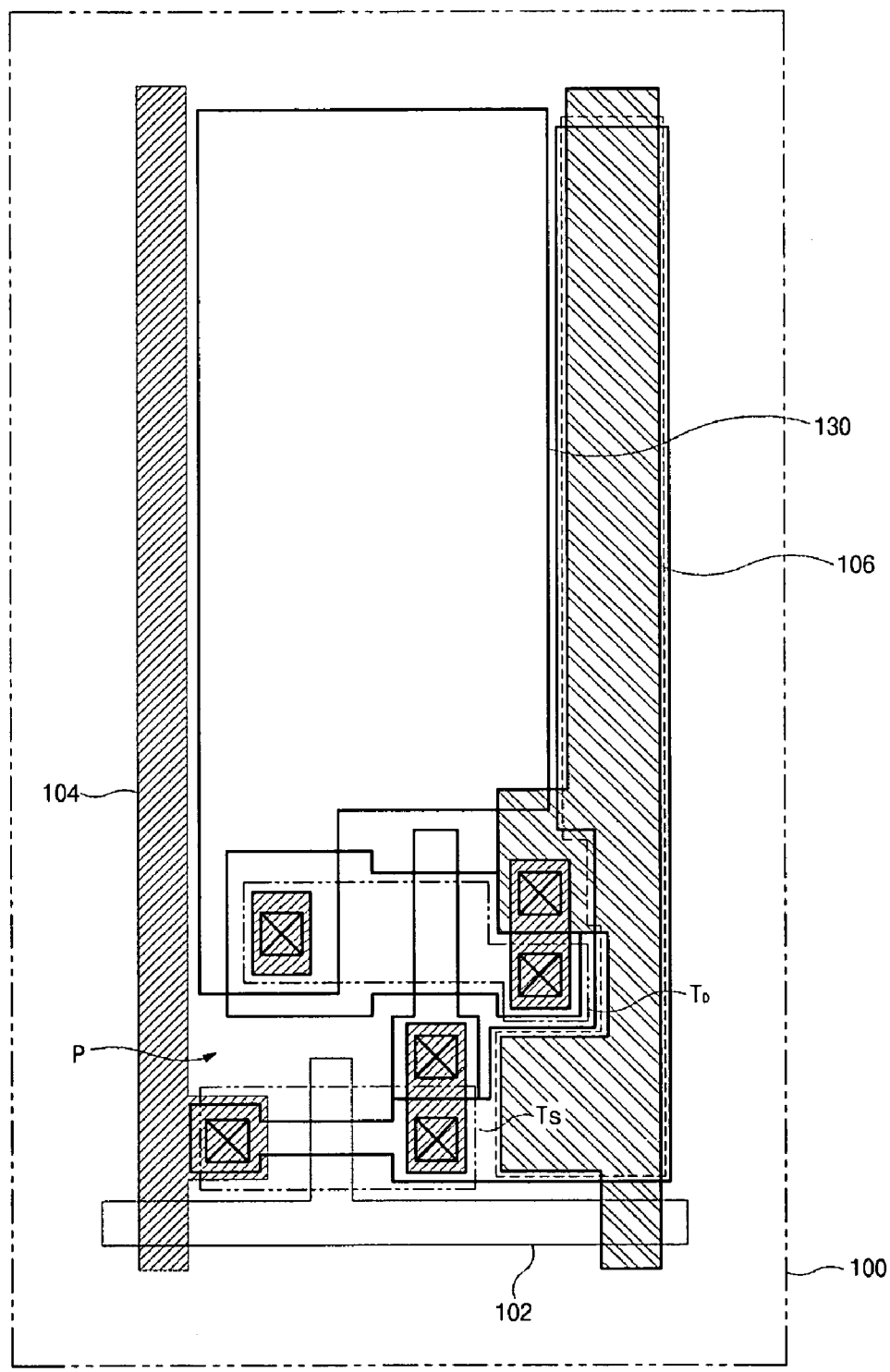
FIG. 4B is a plan view of a pixel region in an exemplary OELD device according to an embodiment of the present invention.

FIG. 4A is a plan view of a display region and a pad region in an exemplary OELD device according to an embodiment of the present invention. FIG. 4B is a plan view of a pixel region in an exemplary OELD device according to an embodiment of the present invention.

Referring to FIGS. 4A and 4B, a substrate 100 includes a display region DD and a pad region PP in a periphery of the display region DD. Although not shown, the display region DD includes a plurality of pixel regions disposed on the substrate 100. A pixel region includes a gate line 102, a data line 104 crossing the gate line 102, and a power line 106 crossing one of the gate line 102 and the data line 104. Further, a switching thin film transistor Ts is connected to the gate line 102 and the data line 104, and a driving thin film transistor $T_D$ is connected to the switching thin film transistor Ts and the power line 106 in the pixel region P.

A gate pad 120, a data pad 122 and a power pad 124 are disposed in the pad region PP. The gate pad 120, the data pad 122 and the power pad 124 are electrically connected to the gate line 102, the data line 104 and the power line 106, respectively. A first electrode 130 is connected to the driving thin film transistor $T_D$ in the pixel region P. An organic electroluminescent layer (not shown) is formed on the first electrode 130, and a second electrode 134 is formed over the entire surface of the substrate 100 having the organic electroluminescent layer.

A dummy pad DP is disposed in the pad region PP. The dummy pad DP is electrically connected to at least one of the power line 106 and the second electrode 134. For example, the dummy pad DP includes a first dummy pad DP1 and a second dummy pad DP2. In addition, a ground pad 150 is disposed in the pad region PP. The ground pad 150 is electrically connected to the second electrode 134.

The pad region PP includes first to fourth pad regions PP1 to PP4. As shown in FIG. 4A, the first pad region PP1 is disposed adjacent to the second pad region PP2. The gate pad 120 and the first dummy pad DP1 are disposed in the first pad region PP1. The data pad 122 and the second dummy pad DP2 are disposed in the second pad region PP2. The power pad 124 is disposed in a third pad portion PP3. The ground pad 150 is disposed in the fourth pad portion PP4. Power signals are applied to the first and second dummy pads DP1 and DP2, respectively.

Although not shown, a power signal and a ground signal may be applied to the first dummy pad DP1 and the second dummy pad DP2, respectively. Conversely, a power signal and a ground signal may be applied to the second dummy pad DP2 and the first dummy pad DP1, respectively. Additionally, the ground signal may be applied to the dummy pad DP having the first and second dummy pads DP1 and DP2. However, one of the first and second dummy pads DP1 and DP2 may be omitted.

Although not shown, the dummy pad DP is electrically connected to an external circuit (not shown) by tape automated bonding. For example, when the first electrode 130 acts as an anode, it may include indium tin oxide. On the other hand, when the second electrode 134 acts as a cathode, it may include one of aluminum (Al), calcium (Ca), magnesium (Mg) and lithium fluorine/aluminum (LiF/Al).

A first contact hole 162 is disposed in the display region DD to connect the second electrode 134 and the ground pad 150. A second contact hole 164 is disposed in the pad region PP to connect the ground pad 150 and the external circuit. In other words, a ground signal is applied to ground pad 150 through the external circuit. A seal pattern 170 is disposed between the display region DD and the pad region PP. Although not shown, the OELD device according to an embodiment of the present invention further includes another substrate or a passivation layer for encapsulation of the OELD device.

Figure 5:
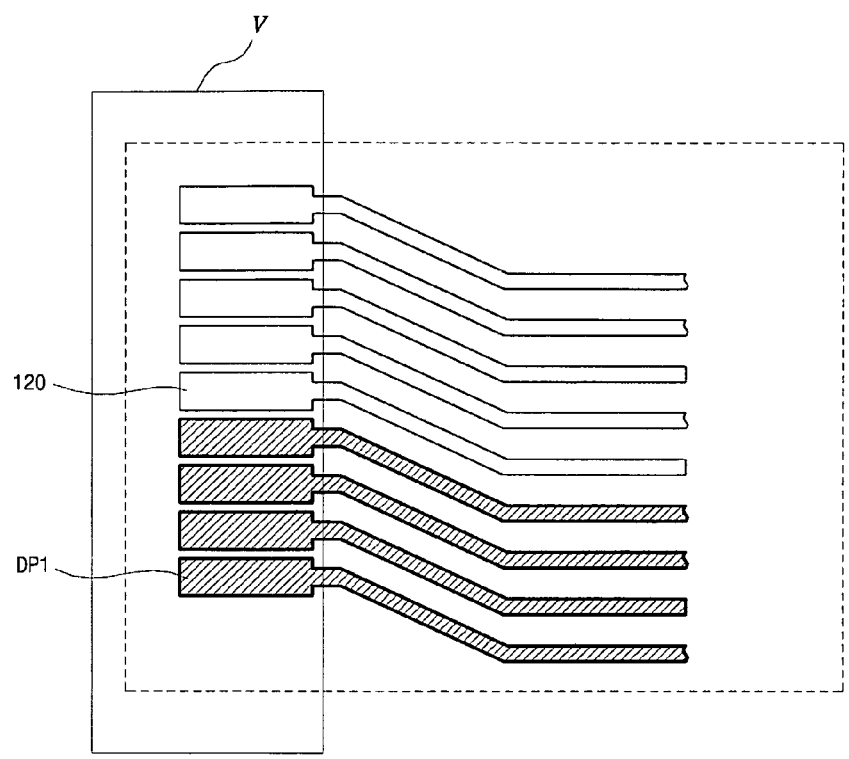
FIG. 5 is a magnified view for portion V shown in FIG. 4A.

FIG. 5 is a magnified view for portion V shown in FIG. 4A. Referring to FIG. 5, although the first dummy pad DP1 is disposed in the same pad region PP as the gate pad 120, a gate signal is not applied to the first dummy pad DP1. One of a power signal and a ground signal is applied to the first dummy pad DP1. A signal applied to the dummy pad DP (shown in FIG. 4A) may be defined as follows.

According to an embodiment of the present invention, the display region DD may include a plurality of gate pads 120, a plurality of data pads 122, a plurality of power pads 124, a plurality of ground pads 150 and a plurality of dummy pads DP. However, these conditions may be changed in accordance with the presence of the power pad 124 and the ground pad 150 or in accordance with the size of the power pad 124 and the ground pad 150. In an embodiment of the present invention, an ELD device having the dummy pad can be manufactured with a large size and provide a uniform image quality.

Figure 6:
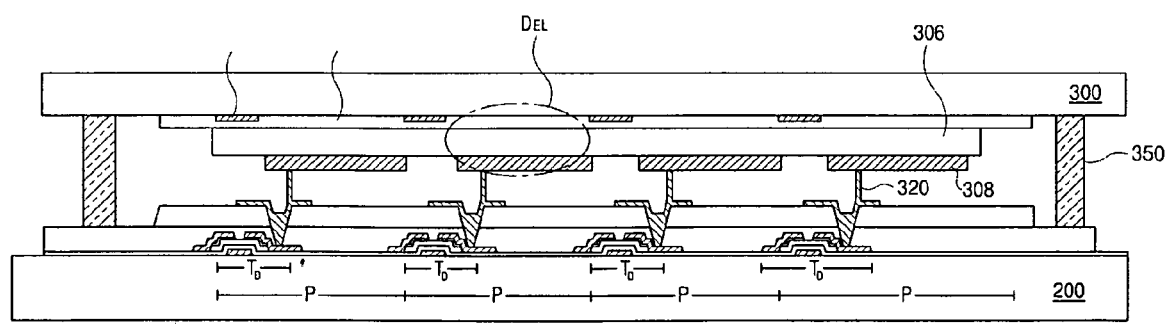
FIG. 6 is a cross-sectional view of an exemplary dual panel OELD device according to an embodiment of the present invention.
Figure 7:
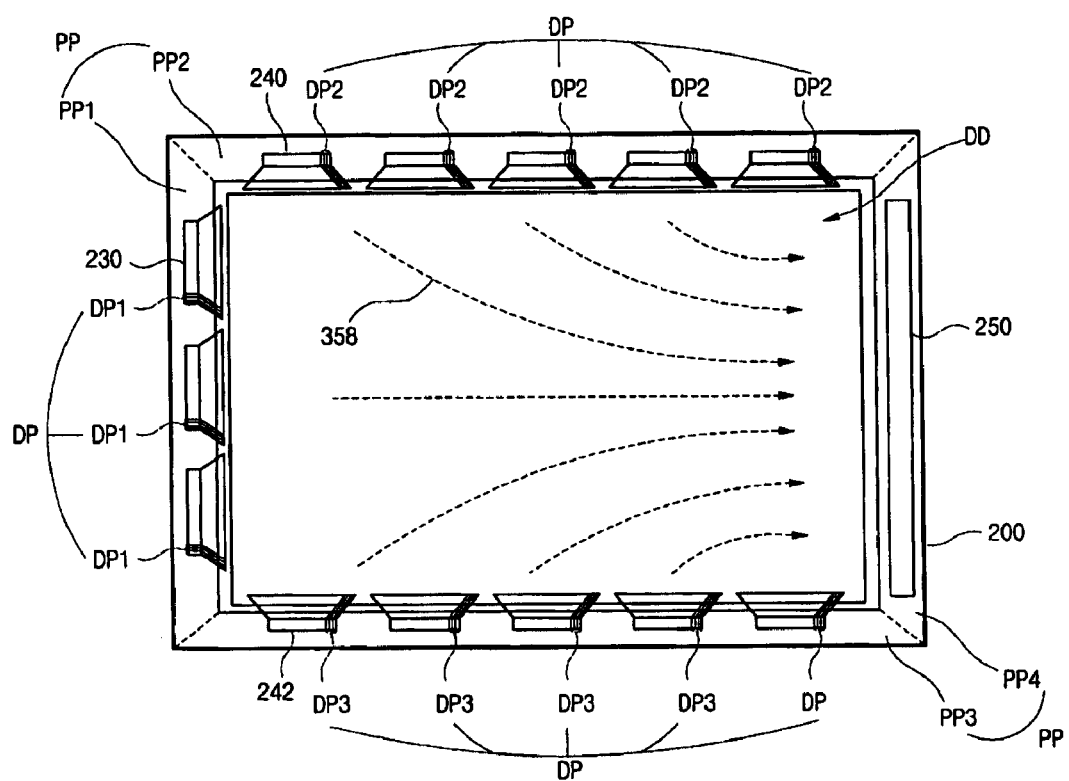
FIG. 7 is a plan view of a display region and a pad region in an exemplary dual panel OELD device according to an embodiment of the present invention.

FIG. 6 is a cross-sectional view of an exemplary dual panel OELD device according to an embodiment of the present invention. FIG. 7 is a plan view of a display region and a pad region in an exemplary dual panel OELD device according to an embodiment of the present invention. Referring to FIGS. 6 and 7, a first substrate 200 includes a display region DD and a pad region PP in a periphery of the display region DD. The display region DD includes at least one pixel region P. Although not shown, a gate line, a data line crossing the gate line, and a power line crossing one of the gate line and the data line are disposed on the first substrate 200 in the display region DD. A switching thin film transistor (not shown) is connected to the gate and data lines. A driving thin film transistor $T_D$ is connected to the switching thin film transistor and the power line 206 in the pixel region P. A second substrate 300 faces and is spaced apart from the first substrate 200. Although not shown, the second substrate 300 corresponds to the display region DD of the first substrate 200. A first electrode 304 is formed on the entire surface of the second substrate 300. An organic electroluminescent layer 306 is formed on the first electrode 304. A second electrode 308 is formed on the organic electroluminescent layer 306 in the pixel region P.

When the first electrode 304 acts as an anode, it may include indium tin oxide. When the second electrode 308 acts a cathode, it may include one of aluminum (Al), calcium (Ca), magnesium (Mg) and lithium fluorine/aluminum (LiF/Al). The first electrode 304, the organic electroluminescent layer 306 and the second electrode 308 form an organic electroluminescent diode $D_{EL}$.

An auxiliary first electrode 302 is formed between the second substrate 300 and the first electrode 302 at a boundary of the pixel region P to lower resistivity of the first electrode 302 acting as the anode. Further, a connection electrode 320 connects the second electrode 300 and the driving thin film transistor $T_D$. The connection electrode 320 is disposed between the first and second substrates 200 and 300. A seal pattern 350 is disposed between the display region DD and the pad region PP to attach the first substrate 200 and the second substrate 300.

Although not shown, a power signal is applied to the power line and the second electrode 308 is electrically the power line through the driving thin film transistor $T_D$. At this time, the power signal is applied to the power line through the dummy pad DP without a power pad. The organic EL layer 306 may include red, green, and blue emission layers to display full-color images. Each of the red, green, and blue emission layers may be disposed in each pixel region P. Carriers or current move in various directions 358 in the display region, as shown in FIG. 7, thereby improving image quality.

A gate pad 230 and a data pad 240 are formed in the pad region PP. The gate pad 230 and the data pad 240 are electrically connected to the gate line and the data line, respectively. A dummy pad DP is formed in the pad region PP. The dummy pad DP is electrically connected to the power line. A ground pad 250 is formed in the pad region PP. The ground pad 250 is electrically connected to the first electrode 304. The pad region PP includes first to fourth pad regions PP1 to PP4. The first pad region PP1 is disposed adjacent to the second pad region PP2.

The dummy pad DP includes a first dummy pad DP1 in the first pad region PP1 and a second dummy pad DP2 in the second pad region PP2. The gate pad 230 and the data pad 240 are disposed in the first pad region PP1 and the second pad region PP2, respectively. The ground pad 250 is disposed in one of the third and fourth regions PP3 and PP4. For example, the data pad 240 is further disposed in the third pad region PP3 facing the second pad region PP2, and the third dummy pad DP3 is also disposed in the third pad region PP3. In this case, the ground pad 250 is disposed in the fourth pad region PP4. Although not shown, the dummy pad DP is electrically connected to an external circuit by tape automated bonding.

As explained above, a power signal may be applied to at least two of the first to third pad regions, thereby reducing a resistance deviation due to a dominant direction of carriers or current. Accordingly, a large size dual panel type OELD having a uniform image can be manufactured.

In accordance with embodiments of the present invention, a high aperture ratio may be obtained in a top emission-type OELD device. In addition, an array element layer including a TFT and an organic EL diode may be independently formed on respective substrates. Thus, undesired effects due to fabrication processes of the organic EL diode may be prevented, thereby improving overall production yield. Furthermore, resistance deviation is reduced by applying at least one of a power signal and a ground signal to a dummy pad in the pad region, which includes one of the gate pad and the data pad. Thus, a large size OELD device having a uniform quality can be manufactured.

It will be apparent to those skilled in the art that various modifications and variations can be made in the organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    a substrate including a display region, and first to fourth pad regions in a periphery of the display region, the display region including a pixel region, the first pad region adjacent to the second pad region, the first pad region facing the third pad region;
    a gate line, a data line crossing the gate line, and a power line on the substrate in the display region, the power line crossing one of the gate line and the data line;
    a switching thin film transistor and a driving thin film transistor in the pixel region, the switching thin film transistor connected to the gate line and the data line, and the driving thin film transistor connected to the switching thin film transistor and the power line;
    a gate pad and a data pad in at least one of the first to fourth pad regions, the gate pad and the data pad electrically connected to the gate line and the data line, respectively;
    a second substrate facing and spaced apart from the first substrate, the second substrate corresponding to the display region of the first substrate;
    a first electrode on an entire surface of the second substrate;
    an organic electroluminescent layer on the first electrode;
    a second electrode on the organic electroluminescent layer in the pixel region;
    a connection electrode connecting the second electrode and the driving thin film transistor, the connection electrode between the first substrate and the second substrate;
    a plurality of dummy pads electrically connected to the power line, the plurality of dummy pads including a first dummy pad in the first pad region and a second dummy pad in the second pad region; and
    a ground pad in the third pad region, the ground pad electrically connected to the first electrode.

2. The device according to claim 1, wherein the gate pad and the data pad are disposed in the first pad region and the second pad region, respectively.

3. The device according to claim 2, wherein the data pad is further disposed in the fourth pad region facing the second pad region.

4. The device according to claim 3, wherein the plurality of dummy pads includes a third dummy pad disposed in the fourth pad region.

5. The device according to claim 1, wherein the dummy pads are electrically connected to an external circuit by tape automated bonding.

6. The device according to claim 1, wherein the first electrode acts as an anode.

7. The device according to claim 6, wherein the first electrode includes indium tin oxide.

8. The device according to claim 1, wherein the second electrode acts as a cathode.

9. The device according to claim 8, wherein the second electrode includes one of aluminum (Al), calcium (Ca), magnesium (Mg) and lithium fluorine/aluminum (LiF/Al).

10. The device according to claim 1, wherein the dummy pads are electrically connected to the second electrode through the power line.

* * * * *